United States Patent
Adam et al.

(10) Patent No.: US 8,828,831 B2
(45) Date of Patent: Sep. 9, 2014

(54) EPITAXIAL REPLACEMENT OF A RAISED SOURCE/DRAIN

(75) Inventors: Thomas N. Adam, Slingerlands, NY (US); Kangguo Cheng, Schenectady, NY (US); Ali Khakifirooz, Mountain View, CA (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/355,691

(22) Filed: Jan. 23, 2012

(65) Prior Publication Data

US 2013/0187205 A1    Jul. 25, 2013

(51) Int. Cl.
*H01L 29/772* (2006.01)
*H01L 29/417* (2006.01)
*H01L 21/8238* (2006.01)

(52) U.S. Cl.
CPC ........ *H01L 29/41725* (2013.01); *H01L 29/772* (2013.01); *H01L 21/823814* (2013.01); *H01L 21/8238* (2013.01)
USPC ........... 438/300; 438/299; 438/301; 438/302; 438/303; 257/E21.431; 257/288

(58) Field of Classification Search
USPC ................................ 438/299–307
See application file for complete search history.

(56) References Cited

U.S. PATENT DOCUMENTS

| | | | | |
|---|---|---|---|---|
| 6,187,641 | B1* | 2/2001 | Rodder et al. | 438/299 |
| 6,335,251 | B2* | 1/2002 | Miyano et al. | 438/300 |
| 2004/0045499 | A1* | 3/2004 | Langdo et al. | 117/84 |
| 2005/0101093 | A1* | 5/2005 | Cheng et al. | 438/303 |
| 2005/0142868 | A1* | 6/2005 | Kuo | 438/663 |
| 2005/0148133 | A1* | 7/2005 | Chen et al. | 438/199 |
| 2008/0102573 | A1* | 5/2008 | Liang et al. | 438/231 |
| 2008/0124878 | A1* | 5/2008 | Cook et al. | 438/300 |
| 2009/0026504 | A1* | 1/2009 | Okuda et al. | 257/255 |
| 2009/0152646 | A1* | 6/2009 | Zhu et al. | 257/408 |
| 2011/0037125 | A1 | 2/2011 | Cheng et al. | |
| 2011/0068396 | A1 | 3/2011 | Cheng et al. | |
| 2011/0175164 | A1 | 7/2011 | Bedell et al. | |
| 2011/0254090 | A1 | 10/2011 | Cheng et al. | |

FOREIGN PATENT DOCUMENTS

EP    0923118 A2    6/1999

OTHER PUBLICATIONS

K. Cheng et al., "Fully depleted extremely thin SOI technology fabricated by a novel integration scheme featuring implant-free, zero-silicon-loss, and faceted raised source/drain," 2009 Symposium on VLSI Technology, Jun. 16-18, 2009, pp. 212-213.

(Continued)

*Primary Examiner* — Julia Slutsker
*Assistant Examiner* — Natalia Gondarenko
(74) *Attorney, Agent, or Firm* — Ira D. Blecker; Katherine S. Brown; Joseph Petrokaitis (57) ABSTRACT

Disclosed is a semiconductor article which includes a semiconductor substrate; a gate structure having a spacer adjacent to a conducting material of the gate structure wherein a corner of the spacer is faceted to create a faceted space between the faceted spacer and the semiconductor substrate; and a raised source/drain adjacent to the gate structure, the raised source/drain filling the faceted space and having a surface parallel to the semiconductor substrate. Also disclosed is a method of making the semiconductor article.

16 Claims, 10 Drawing Sheets

(56) References Cited

OTHER PUBLICATIONS

K. Cheng et al., "Extremely thin SOI (ETSOI) CMOS with record low variability for low power system-on-chip applications," 2009 IEEE International Electron Devices Meeting (IEDM), Dec. 7-9, 2009, 4 pages.

A. Khakifirooz et al., "Challenges and Opportunities of Extremely Thin SOI (ETSOI) CMOS Technology for Future Low Power and General Purpose System-on-Chip Applications," 2010 IEEE International Solid-State Circuits Conference Digest of Technical Papers (ISSCC), pp. 110-111.

A. Khakifirooz et al., "High-Performance Partially Depleted SOI PFETs With In Situ Doped SiGe Raised Source/Drain and Implant-Free Extension," IEEE Electron Device Letters, vol. 32, Issue 3, Mar. 2011, pp. 267-269.

* cited by examiner

EPITAXIAL REPLACEMENT OF A RAISED SOURCE/DRAIN

BACKGROUND

The present invention relates to semiconductor integrated circuits and, more particularly, relates to enhancing the performance of raised source/drains in MOSFET semiconductor devices.

In-situ doped raised source/drain (RSD) has become a viable approach to enhance the performance of advanced MOSFETs (metal oxide semiconductor field effect transistors) by lowering the raised source/drain and simultaneously achieving ultra shallow junction. A side effect of RSD is the parasitic capacitance between the gate and the RSD. Faceted RSD has been demonstrated as an effective means to reduce the gate-to-source/drain parasitic capacitance.

BRIEF SUMMARY

The various advantages and purposes of the exemplary embodiments as described above and hereafter are achieved by providing, according to a first aspect of the exemplary embodiments, a method of epitaxial replacement of a raised source/drain (RSD) including: forming a gate structure on a semiconductor substrate; forming a faceted dummy RSD adjacent to the gate structure such that a corner is formed between the gate structure and the faceted dummy RSD; forming a dielectric material over the corner; removing the faceted dummy RSD adjacent to the gate structure to leave a faceted corner in the dielectric material; epitaxially growing an RSD adjacent to the gate structure including epitaxially growing the RSD in the faceted corner in the dielectric material.

According to a second aspect of the exemplary embodiments, there is provided a method of epitaxial replacement of a raised source/drain (RSD) including: forming first and second gate structures on a semiconductor substrate; forming a faceted dummy RSD adjacent to each of the first and second gate structures; depositing a dielectric material over the first and second gate structures and the faceted dummy RSD adjacent to each of the first and second gate structures; applying a first masking material to the dielectric material over the first gate structure and the faceted dummy RSD adjacent to the first gate structure; forming a spacer adjacent to the second gate structure from the dielectric material while removing the dielectric from the top of the second gate structure and the faceted dummy RSD adjacent to the second gate structure; removing the faceted dummy RSD adjacent to the second gate structure to leave a faceted corner in the spacer adjacent to the second gate structure; epitaxially growing an RSD adjacent to the second gate structure including epitaxially growing the RSD in the faceted corner in the spacer adjacent to the second gate structure; applying a second masking material to the second gate, spacer and the epitaxially grown RSD adjacent to the second gate structure; forming a spacer adjacent to the first gate structure from the dielectric material while removing the dielectric from the top of the first gate structure and the faceted dummy RSD adjacent to the first gate structure; removing the faceted dummy RSD adjacent to the first gate structure to leave a faceted corner in the spacer adjacent to the first gate structure; epitaxially growing an RSD adjacent to the first gate structure including epitaxially growing the RSD in the faceted corner in the spacer adjacent to the first gate structure; and annealing the semiconductor substrate.

According to a third aspect of the exemplary embodiments, there is provided a semiconductor article including: a semiconductor substrate; a gate structure having a spacer adjacent to a conducting material of the gate structure wherein a corner of the spacer is faceted to create a faceted space between the faceted spacer and the semiconductor substrate; and a raised source/drain adjacent to the gate structure, the raised source/drain filling the faceted space and having a surface parallel to the semiconductor substrate.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 10 are cross-sectional views illustrating the manufacturing of a semiconductor structure with epitaxial replacement of a raised source/drain according to the exemplary embodiments wherein:

DETAILED DESCRIPTION

To reduce any possible penalties in parasitic capacitance due to the RSD structure, a faceted epitaxy process is preferably employed. However, manufacturing MOSFETs with RSD by epitaxy with a faceted profile and high dopant concentration, particularly for the highly scaled devices with tight pitches, has been found extremely difficult to achieve. Therefore, there is a need for improving the manufacturing of MOSFETs with in-situ doped RSD.

There is proposed in the exemplary embodiments a replacement RSD scheme which decouples the faceted RSD profile requirement and the in-situ doping. According to the exemplary embodiments, a dummy RSD with a faceted profile is first formed after gate patterning and a spacer is then formed. The dummy RSD then may be removed and an in-situ doped epitaxy is performed to form the real RSD.

Figure 1:
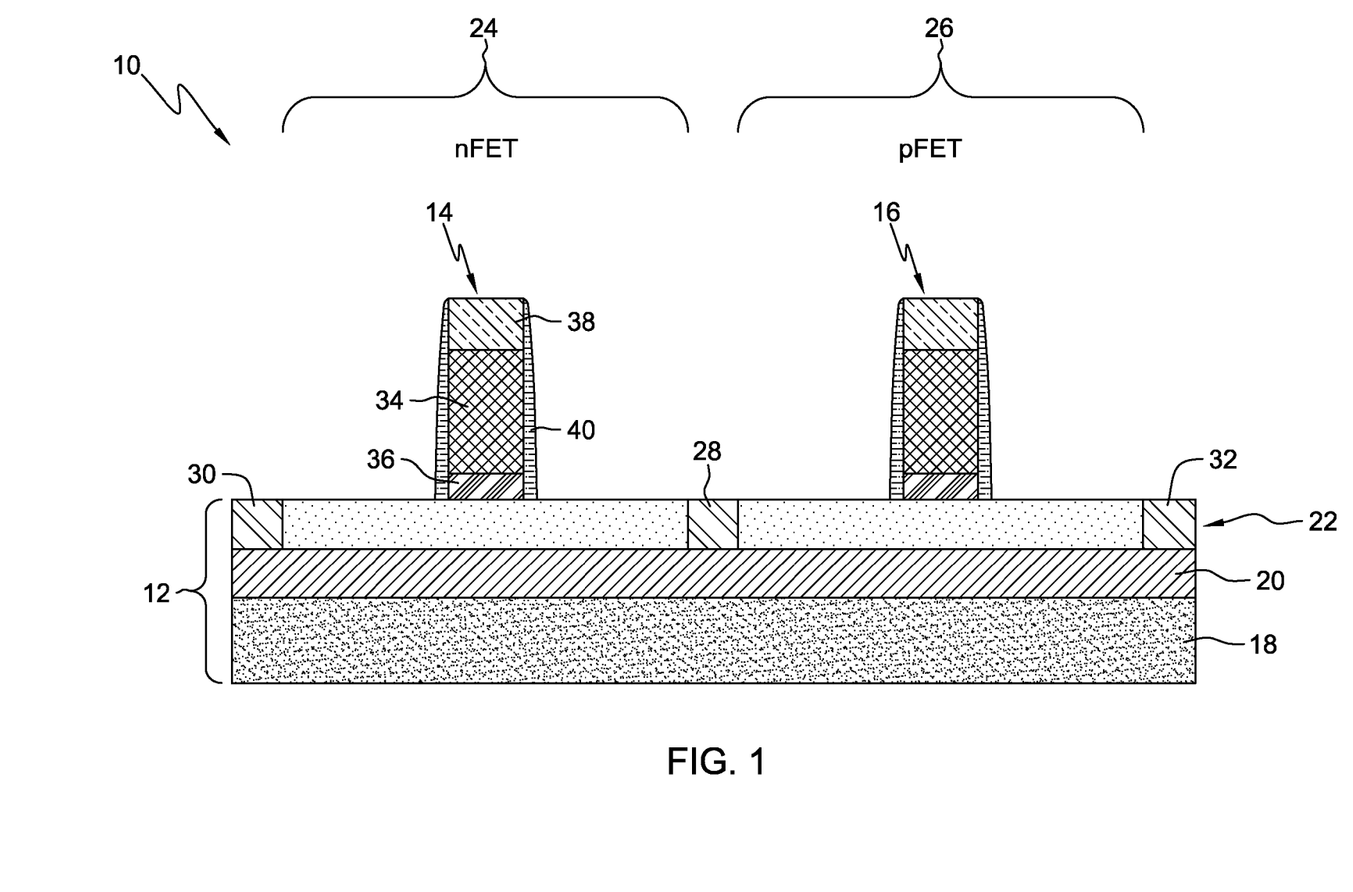
FIG. 1 illustrates the forming of gate structures on a semiconductor substrate having nFET and pFET regions.

Referring to the Figures in more detail, and particularly referring to FIG. 1, there is illustrated the results of initial processing steps that produce a semiconductor structure 10 that includes semiconductor substrate 12 having semiconductor gate structures 14, 16. The semiconductor substrate may be any semiconductor substrate including bulk semiconductor substrates and semiconductor on insulator (SOI) substrates such as ETSOI (extra thin semiconductor on insulator) and PDSOI (partially-depleted semiconductor on insulator). The particular semiconductor substrate is unimportant to the present invention.

The semiconductor material making up the bulk semiconductor substrate may be any semiconductor material, including but not limited to, silicon, silicon germanium, germanium, carbon doped silicon (carbon 0.2 atomic percent (a/o) to 6 a/o, with 0.5 a/o to 2.5 a/o typical), a III-V compound semiconductor, or a II-VI compound semiconductor. Similarly, the semiconductor material making up the semiconductor on insulator (SOI) layer of an SOI substrate may be any semiconductor material, including but not limited to, silicon, silicon germanium, germanium, a III-V compound semiconductor, or a II-VI compound semiconductor.

The semiconductor substrate 12 may also comprise a layered semiconductor such as, for example, silicon/silicon germanium, a silicon-on-insulator or a silicon germanium-on-insulator. A portion of the semiconductor substrate 12 or the entire semiconductor substrate 12 may be amorphous, polycrystalline, or monocrystalline.

For purposes of illustration and not limitation, the semiconductor substrate 12 shown in FIG. 1 may be an SOI substrate and may be an ETSOI substrate or a PDSOI substrate. The semiconductor substrate 12 includes a semiconductor base 18, a buried insulating layer 20 and a top semiconductor layer 22. The buried insulating layer 20 may be an oxide layer and, further, may be referred to as a BOX (buried oxide) layer. The semiconductor substrate 12 may be formed by conventional means.

The semiconductor substrate 12 may further include a first device region 24 and a second device region 26 separated by an isolation region 28. A first gate structure 14 may be positioned in the first device region 24 of the substrate 12 and a second gate structure 16 may be positioned in the second device region 26 of the substrate 12. There may be other isolation regions 30, 32 to separate first device region 24 from a third device region (not shown) and second device region 26 from a fourth device region (not shown), respectively.

First device region 24 may also be referred to as an N-type device region (where an nFET device may be formed) or a P-type device region (where a pFET device may be formed), while second region 26 may also be referred to as a P-type device region or an N-type device region, in which the first device region 24 has a different conductivity than the second device region 26. For purposes of illustration and not limitation, FIG. 1 illustrates a first device region 24 where an nFET device may be formed and second device region 26 where a pFET device may be formed.

The isolation region 28 separates the device regions 24, 26 of the SOI layer 22 and may be in direct physical contact with an upper surface of the BOX layer 20 or may extend into BOX layer 20. Isolation region 28, as well as isolation regions 30, 32 may be formed by conventional means.

The first and second gate structures 14, 16 may be formed by conventional means. The first and second gate structures 14, 16 may each include a gate conductor 34 atop a gate dielectric 36. Gate conductor 34 material may be polysilicon, but may also include elemental metals, metal alloys, metal silicides, and/or other conductive materials. Gate dielectric 36 may be a dielectric material, such as silicon oxide (SiO2), silicon nitride, oxynitride, or alternatively high-k dielectrics, such as oxides of Ta, Zr, Al, Hf or combinations thereof. The first and second gate structures 14, 16 may also include a gate cap 38 such as silicon nitride.

A set of first spacers 40 may be conventionally formed in direct contact with the sidewalls of the first gate structure 14 and second gate structure 16. The first spacers 40 may be composed of a dielectric, such as nitride, oxide, oxynitride, or a combination thereof. The thickness of the first spacers 40 determines the proximity of the subsequently formed raised source/drain (RSD) regions to the channel of the device.

The first and second gate structures 14, 16 may be the real gate structures in the case of a gate-first process or may be dummy gate structures in the case of a gate-last process.

Figure 2:
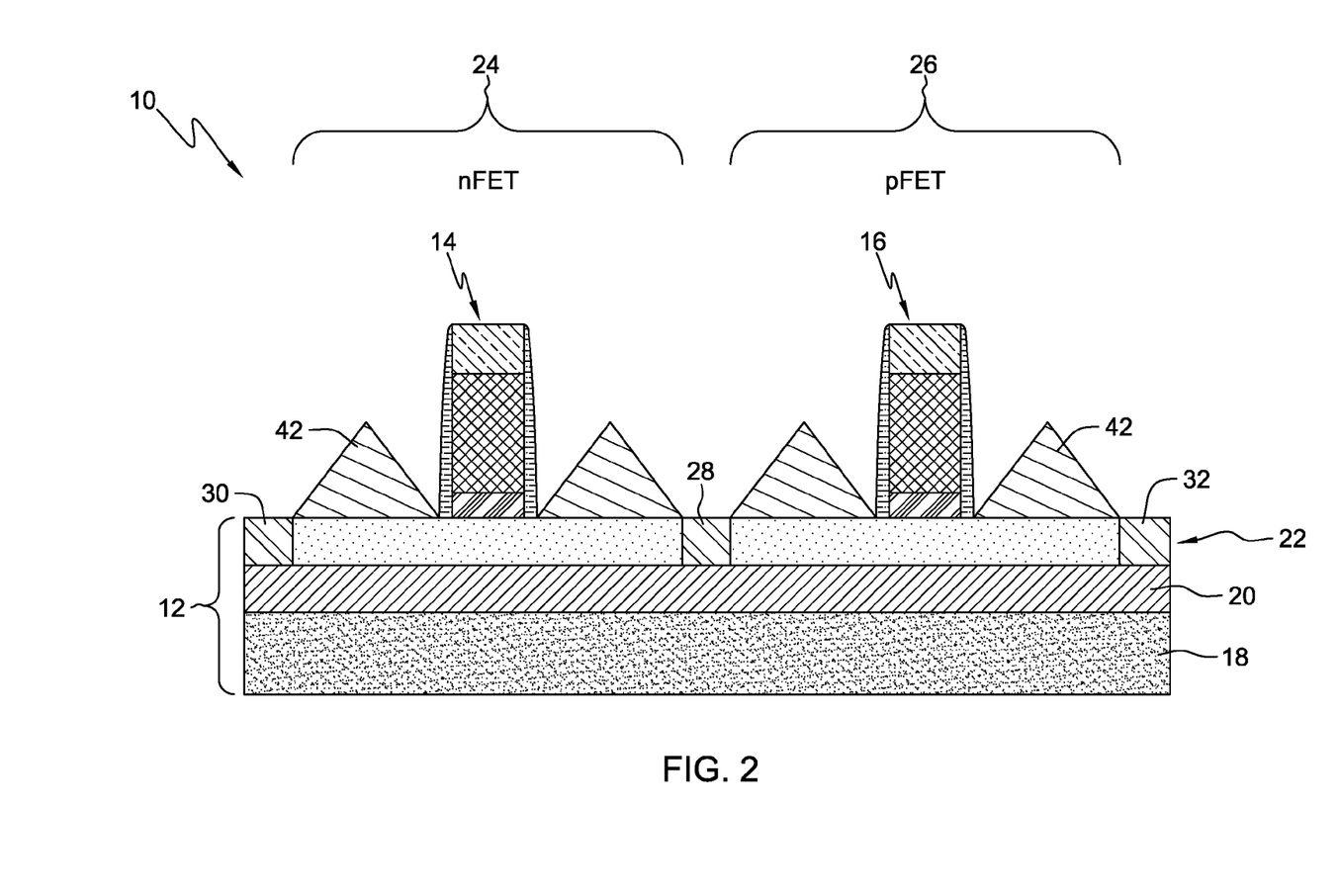
FIG. 2 illustrates the forming of dummy RSDS adjacent to the gate structures.

Referring now to FIG. 2, dummy RSD structures 42 may be formed. In an exemplary embodiment, the dummy RSD structures 42 may comprise silicon germanium (SiGe). The dummy RSD structures 42 are faceted and may be grown from the 501 layer 22 in a selective epitaxial deposition process. Faceting may be tailored during the selective epitaxial deposition process by adjusting the alloy and dopant concentration, and reactor temperature, pressure, and etchant and precursor flows. As an example, high-germanium percentage silicon germanium (>20%) favors the evolution of <111> facets at low temperatures (<650 C), low pressures (<50 T, preferably UHV), and high partial pressures of HCl. Shallower facets (<220>, <113>, etc.) or flat morphologies evolve at moderate temperatures (near 650 C) but high precursor partial pressures and minimal etchant flows.

Silicon germanium is preferably used since it may be removed selectively to silicon later, when the dummy epitaxy is removed. Any other epitaxial material that forms facets and may be removed selectively to the silicon underneath it may be used. Silicon germanium is preferred because of its selectivity to silicon and can be easily selectively removed. Phosphorous doped silicon (Si:P) can work too, since it may be removed selectively to silicon, but not as easily as silicon germanium. The dummy RSD structures 42 will be selectively removed in a later process step but are important now for forming a facet with respect to the first and second gate structures 14, 16.

Figure 3:
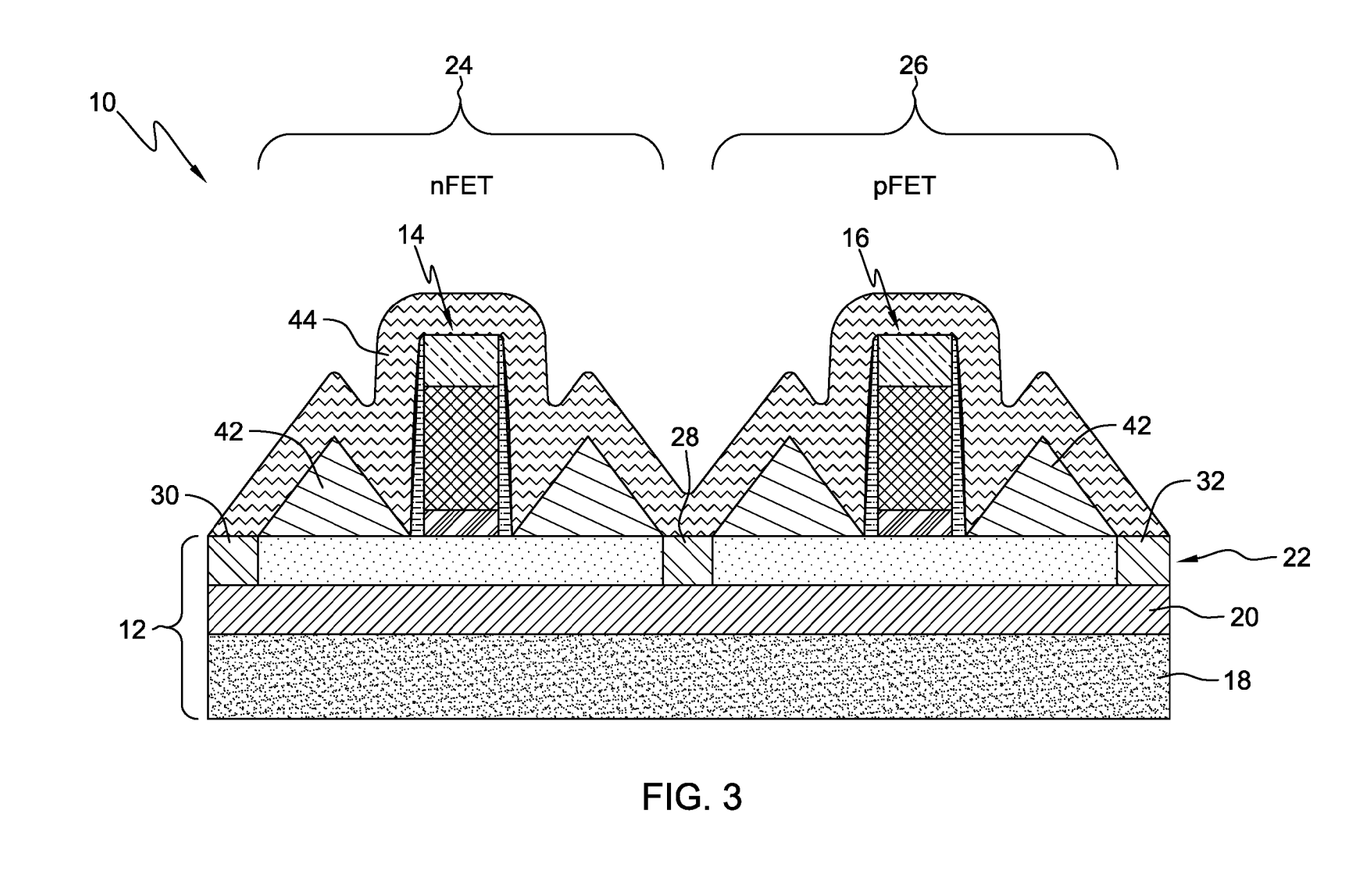
FIG. 3 illustrates the deposition of a dielectric layer over the gate structures and dummy RSDS.

Referring now to FIG. 3, a dielectric layer 44 is blanket deposited so as to cover the semiconductor structure 10 including the first and second gate structures 14, 16 and dummy RSD structures 42. The dielectric layer 44 may comprise, for example, silicon nitride, silicon oxide, silicon oxynitride, boron nitride, high-k dielectric or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 4:
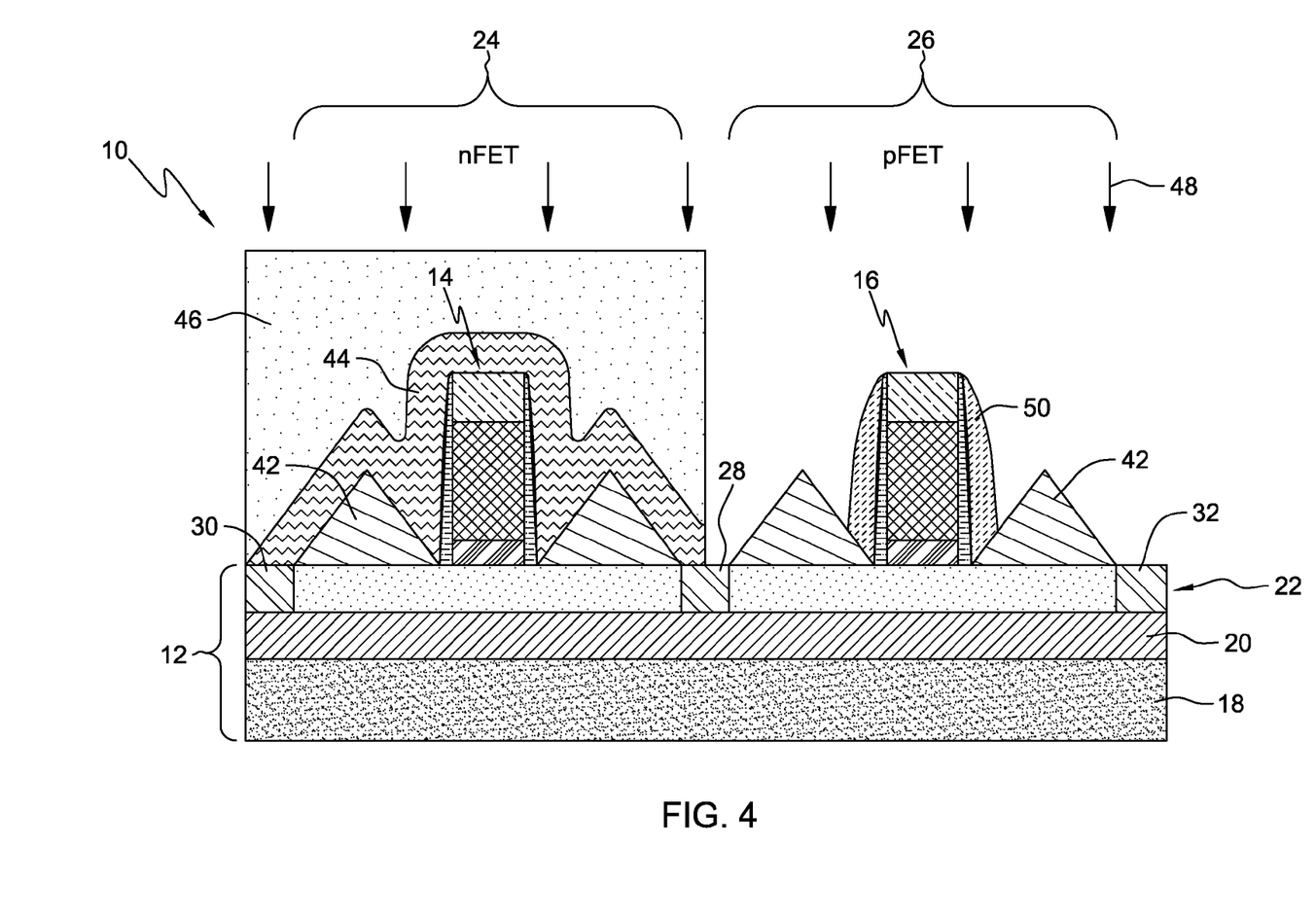
FIG. 4 illustrates the masking of the nFET region while removing the dielectric layer in the pFET region.

As illustrated in FIG. 4, the first device region 24 is masked off with a photoresist 46 while the second device region 26 is not masked off. The photoresist mask 46 may be conventionally formed by blanket deposition of a photoresist, exposing the photoresist to a suitable source of radiation and then developing to remove the unwanted photoresist. The semiconductor structure 10 then may undergo a reactive ion etching (RIE) process, indicated by arrows 48, to remove the dielectric layer 44 from the dummy RSD structures 42 in the second device region 26 and form second spacer 50 adjacent to second gate structure 16.

Figure 5:
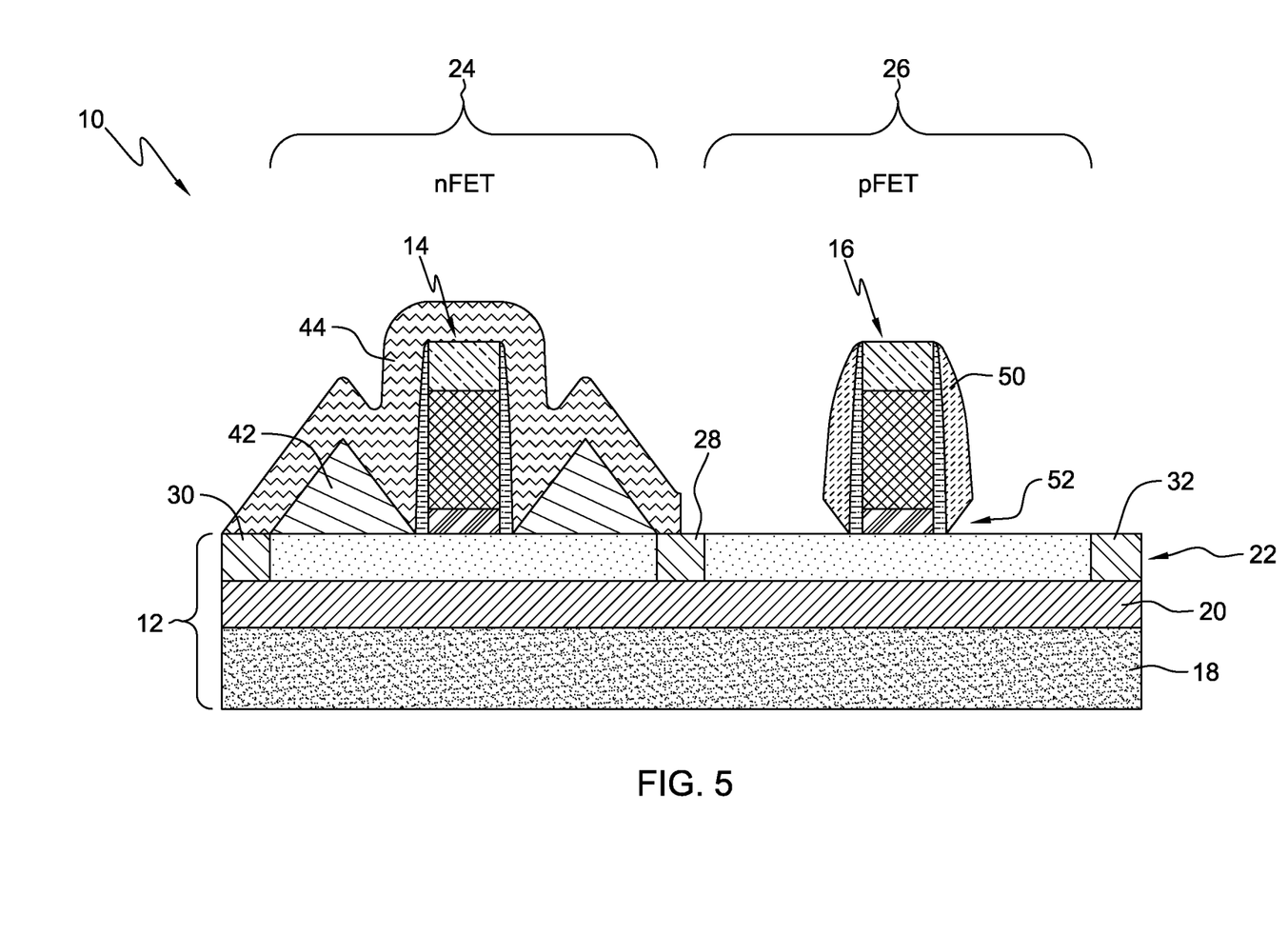
FIG. 5 illustrates the removal of the dummy RSD in the pFET region.

The photoresist mask 46 shown in FIG. 4 may be conventionally stripped such as by an oxygen plasma to result in the structure illustrated in FIG. 5. The dummy RSD structures 42 in the second device region 26 are also removed such as by a gas-based HCl etch (or any other halide-based etch, i.e. chlorine, fluorine, etc.). The gas-based etch may be performed in the epitaxial reactor, The RSD structures 42 may also be removed by a wet etch such as TMAH (Tetramethylammonium hydroxide). The dummy RSD structures 42, being made from SiGe, may be easily and selectively removed by the HCl etch in the second device region 26 without adversely affecting the underlying SOI layer 22. It is noted that with the removal of the dummy RSD structures 42 from the second device region 26, facets 52 remain in the second spacer 50. The dummy RSD structures 42 in the first device region 24 are protected by dielectric layer 44 and so are not removed.

Figure 6:
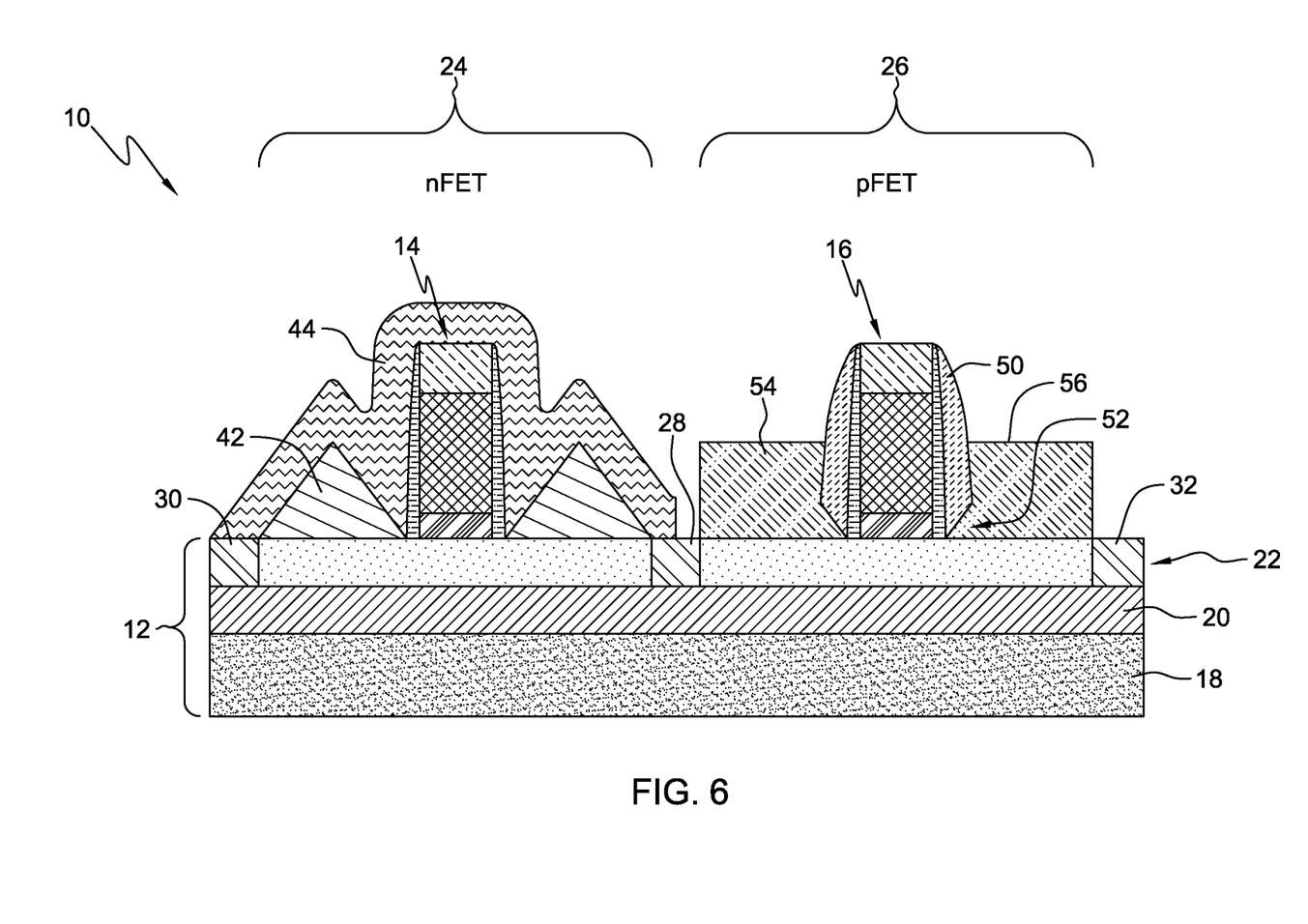
FIG. 6 illustrates the forming of the real RSD in the pFET region.

Referring now to FIG. 6, an in-situ doped RSD 54 is epitaxially grown on SOI layer 22 in the second device region 26. By in-situ doped, it is meant that the RSD 54 is doped while the RSD 54 is epitaxially grown, with the dopant gas flowing at the same time as the deposition gases. It should be understood that in-situ doping is optional and the RSD 54 may be doped by other means. The RSD 54 is grown by a non-faceted epitaxial growth process so that a planar surface 56 approximately parallel with SOI layer 22 is obtained. The non-faceted epitaxially grown RSD 54 may be formed by adjusting the epitaxial deposition parameters as described previously. While the RSD 54 is grown by a non-faceted epitaxial growth process, the RSD 54 fills the facet 52 in second spacer 50 so that the RSD 54 forms a faceted interface with second gate structure 16 at the corner of the second gate structure 16 and SOI layer 22. In a preferred embodiment, the in-situ doped RSD 54 may be in-situ boron-doped silicon germanium (ISBD SiGe). The boron doping may be approximately $1\times10^{18}$ to $1\times10^{22}$ atoms/cm$^3$ with $1\times10^{20}$ to $4\times10^{20}$ atoms/cm$^3$ being more common.

Figure 7:
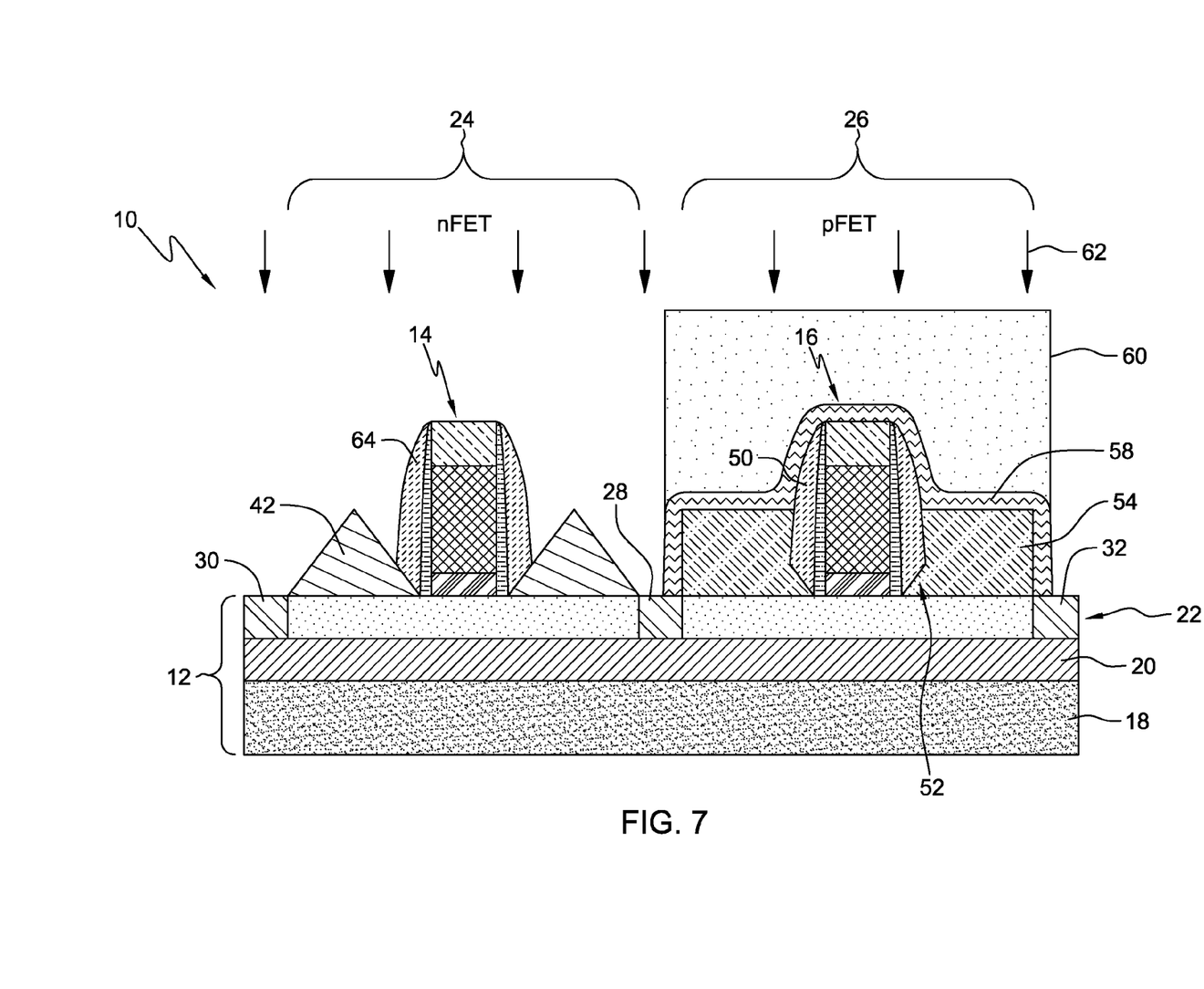
FIG. 7 illustrates the masking of the pFET region and removing of the dielectric layer in the nFET region.

Referring now to FIG. 7, a thin hardmask 58, such as 3 nanometers of silicon oxide, is selectively deposited in the second device region 26 so as to cover the second gate structure 16, second spacer 50 and RSD 54. The hardmask 58 may be removed from the first device region 24 by any etch selective to the dielectric layer 44. For example, if the dielectric layer 44 is silicon nitride and the hardmask 58 is an oxide, oxide may be etched by an aqueous etchant containing hydrofluoric acid selective to nitride. As shown in FIG. 7, the hardmask 58 may be removed from the dielectric layer 44 in the first device region 24 as just described. Then, the second device region 26 is masked off with a photoresist 60 while the first device region 24 is not masked off. The photoresist mask 60 may be conventionally formed by blanket deposition of a photoresist, exposing the photoresist to a suitable source of radiation and then developing to remove the unwanted photoresist. The semiconductor structure 10 then may undergo a reactive ion etching (RIE) process, indicated by arrows 62, to remove the dielectric layer 44 from the dummy RSD structures 42 in the first device region 24 and form second spacer 64 adjacent to first gate structure 14. In an alternative process flow, the process step of removing the hardmask 58 from the dielectric layer 44 in the first device region 24 may be skipped and then after the RIE process described above, the hardmask 58 would become part of the spacer 64 in the first device region 24.

Figure 8:
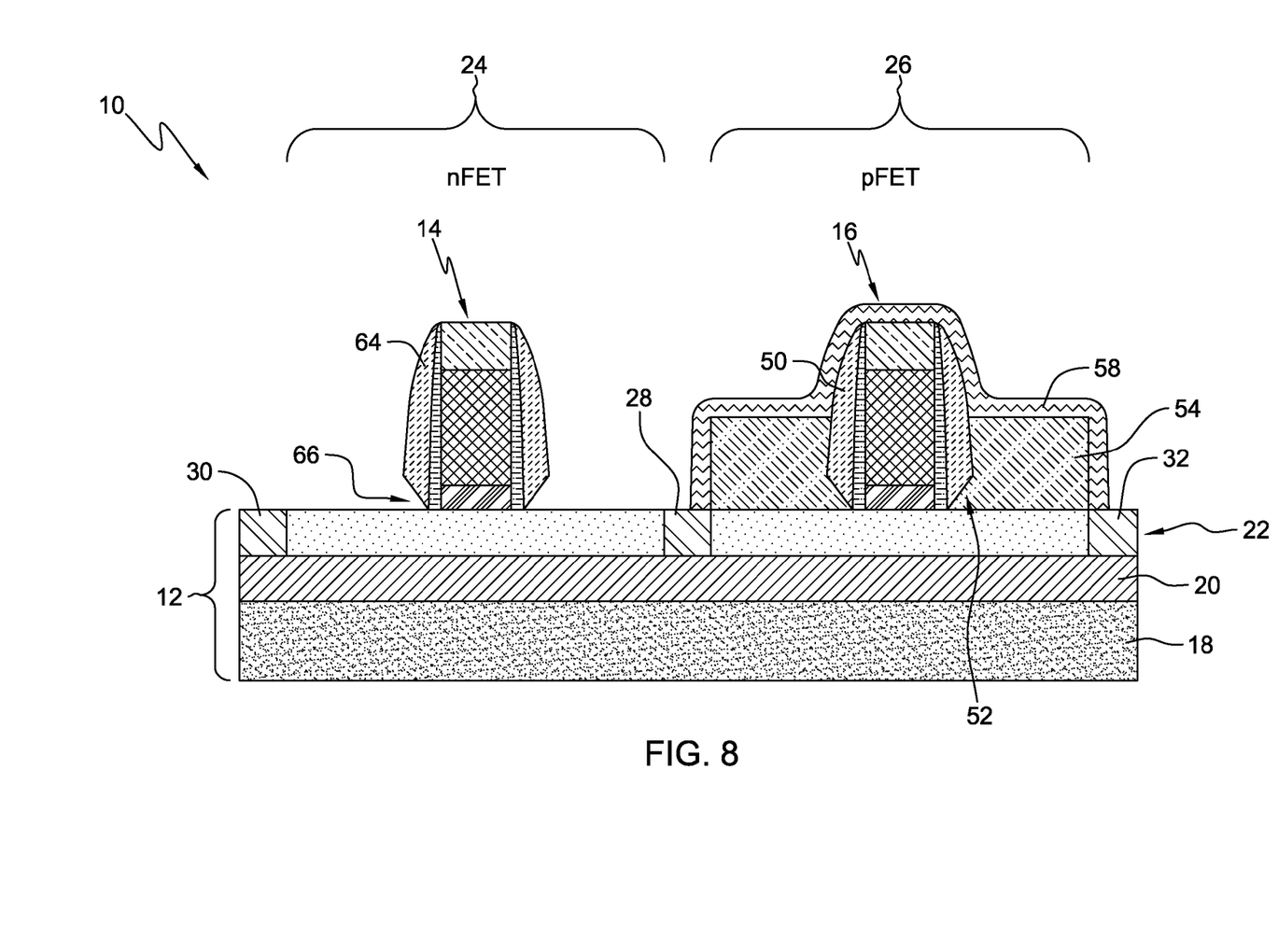
FIG. 8 illustrates the removal of the dummy RSD in the nFET region.

The photoresist 60 shown in FIG. 7 may be conventionally stripped such as by an oxygen plasma to result in the structure illustrated in FIG. 8. The dummy RSD structures 42 in the first device region 24 are also removed such as by an HCl etch. The dummy RSD structures 42, being made from SiGe, may be easily and selectively removed by the HCl etch without affecting the underlying SOI layer 22. It is noted that with the removal of the dummy RSD structures 42 from the first device region 24, facets 66 remain in the second spacer 64. The second gate structure 16 and RSD 54 in the second device region 26 are protected by hardmask 58 and so are not affected by the etching of the dummy RSD structures 42 in the first device region 24.

Figure 9:
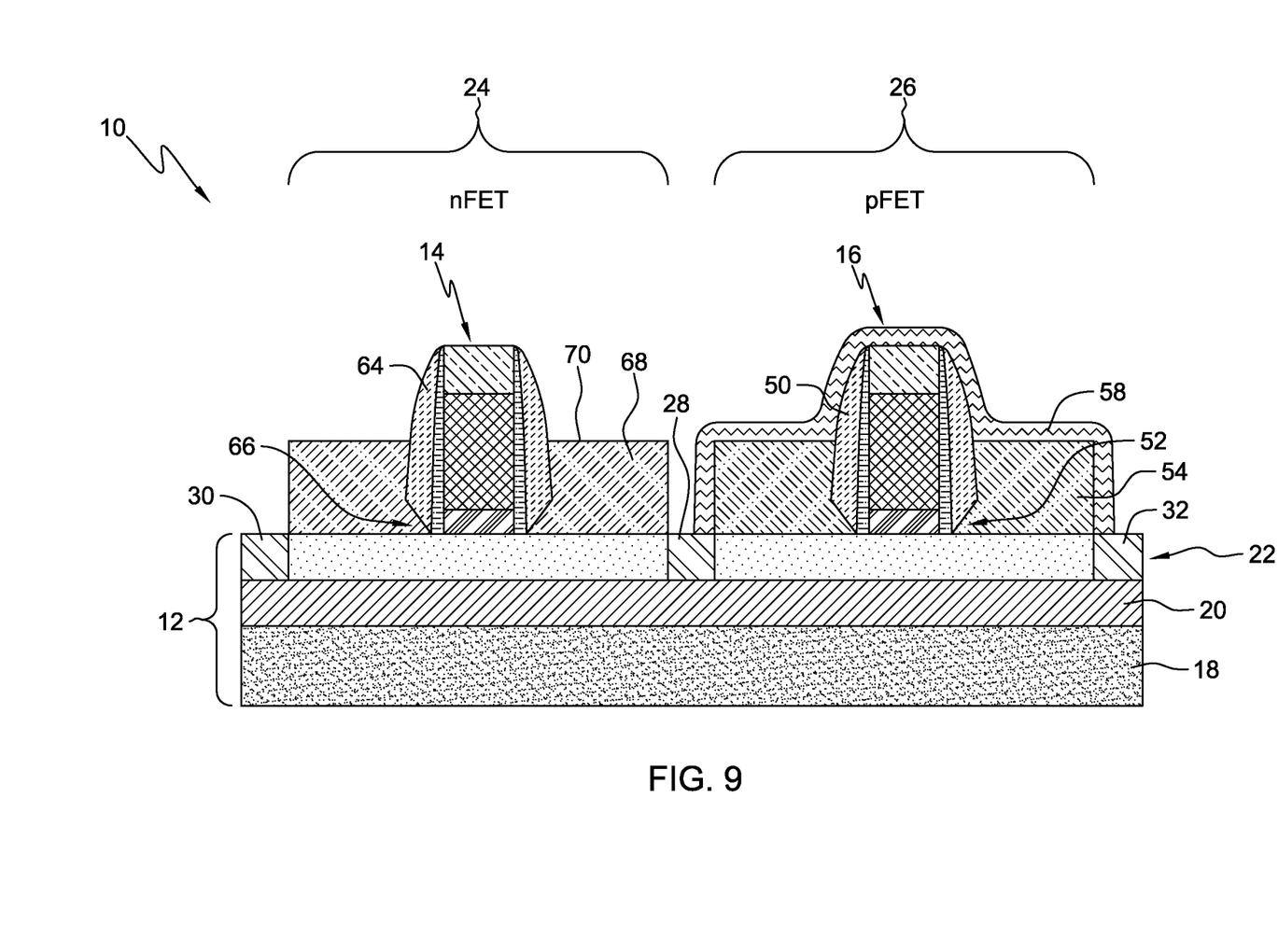
FIG. 9 illustrates the forming of the real RSD in the nFET region.

Referring now to FIG. 9, an in-situ doped RSD 68 is epitaxially grown in the first device region 24. It should be understood that in-situ doping is optional and the RSD 68 may be doped by other means. The RSD 68 is grown by a non-faceted epitaxial growth process similar to that for RSD 54 so that a planar surface 70 approximately parallel with SOI layer 22 is obtained. While the RSD 68 is grown by a non-faceted epitaxial growth process, the RSD 68 fills the facet 66 in second spacer 64 so that the RSD 68 forms a faceted interface with first gate structure 14 at the corner of the first gate structure 14 and SOI layer 22. In a preferred embodiment, the in-situ doped RSD 68 may be in-situ phosphorus-doped silicon (ISPD Si), in-situ phosphorus-doped and carbon-doped silicon (ISPD Si:C), in-situ arsenic-doped silicon (ISAD Si) or in-situ phosphorus-doped silicon germanium (ISPD SiGe). The approximate doping of the silicon or silicon germanium may be $1\times10^{18}$ to $1\times10^{22}$ atoms/cm$^3$ with $1\times10^{20}$ to $7\times10^{20}$ atoms/cm$^3$ being more common.

Figure 10:
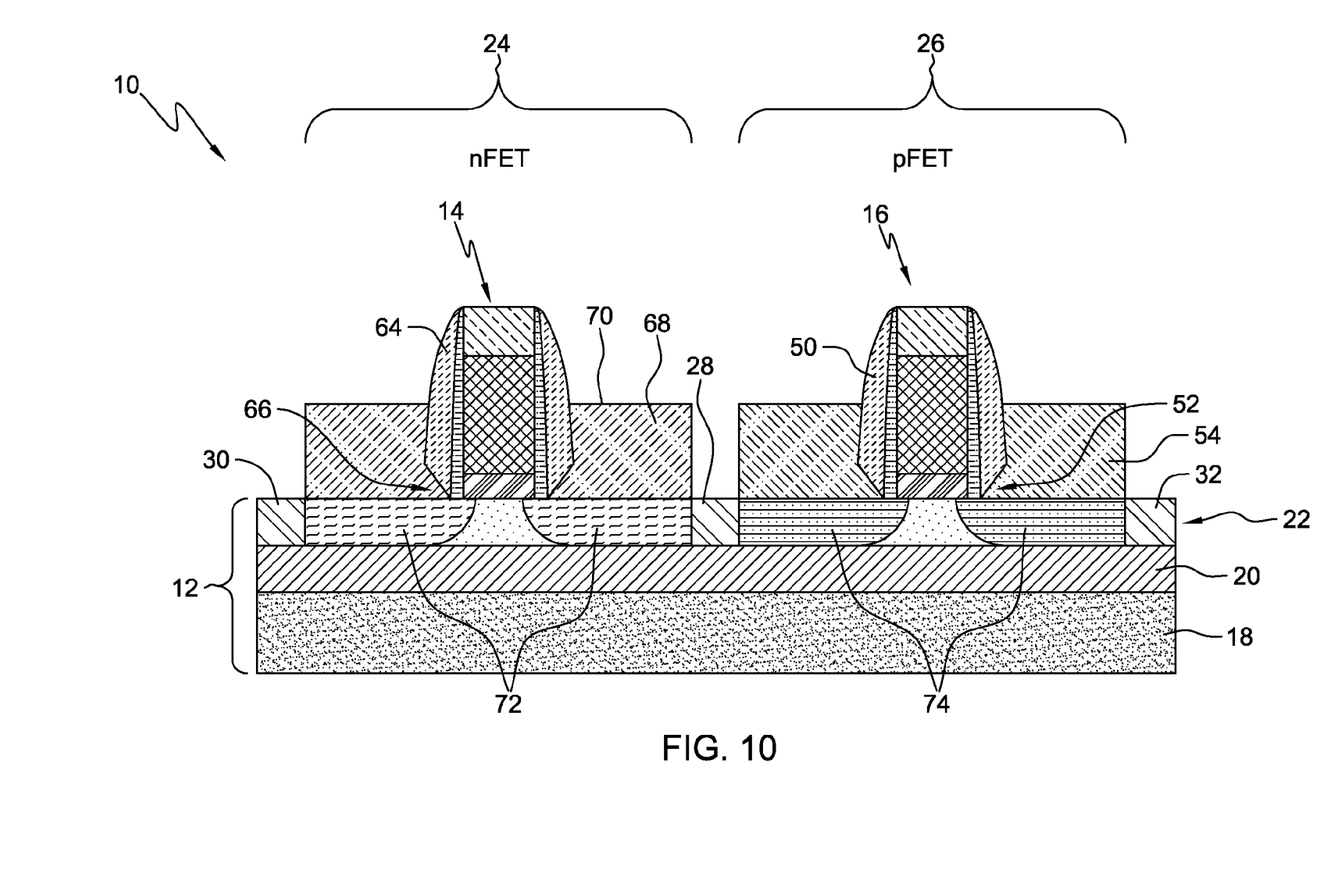
FIG. 10 illustrates the annealing of the semiconductor structure to form extensions in the semiconductor substrate.

The semiconductor structure 10 then may undergo a fast anneal to drive the dopants from the RSD 68 into the SOI layer 22 to form extensions 72 and the dopants from the RSD 54 into the SOI layer 22 to form extensions 74. The resulting structure is illustrated in FIG. 10. In a preferred embodiment, the fast anneal may be a spike anneal in which the semiconductor structure is rapidly heated to a peak temperature of approximately 1000-1100° C. and then immediately cooled after reaching the peak temperature. In addition, the fast anneal may also include rapid thermal anneal (RTA), laser anneal, flash anneal, furnace anneal, or any suitable combination of these techniques. The anneal temperature, depending on the anneal technique, may range from 600 C to 1300 C.

It should be understood that the fast anneal may be optional in those cases where it is not necessary to drive in the dopants. For example, if the extension is formed by an implant and laser anneal followed by forming of the RSD, a light anneal may just be necessary to link up the RSD with the extension.

If the first and second gate structures 14, 16 cannot tolerate the high temperatures of the fast anneal, then a gate-last process may be needed to replace the first and second gate structures 14, 16 (which would be dummy gate structures) after the fast anneal with the real first and second gate structures 14, 16.

The hardmask 58 shown in FIG. 9 may be conventionally removed either before or after the fast anneal. Conventional removal of the hardmask 58 may be by any suitable etch. For example, in the case that the hardmask 58 is silicon oxide, it may be removed by an aqueous solution containing hydrofluoric acid. However, the hardmask 58 should be in place during the formation of the in-situ doped RSD 68.

The first and second gate structures 14, 16 may be the real gate structures which would remain in place during further processing. These first and second gate structures 14, 16 may be formed by a gate first process. Alternatively, the first and second gate structures 14, 16 shown, for example, in FIG. 1 may be dummy structures and it may be desirable to replace the dummy first and second gate structures 14, 16 with real first and second gate structures 14, 16 after formation of the epitaxially formed RSDS 54, 68 shown, for example, in FIG. 10 in a gate last process.

There are at least two significant advantages to the exemplary embodiments. A first significant advantage is that the RSD that replaces the dummy RSD is grown by a non-faceted epitaxial process and yet a faceted epitaxial RSD is obtained at the corner where the RSD meets the gate structure. Another significant advantage is the first spacer is the same for both the nFET and pFET gate structures so that the replacement RSD is spaced from the channel the same amount for both the nFET and pFET gate structures.

While not shown, it should be understood that further processing may take place to form contacts in the first and second device regions 24, 26 as well as back end of the line processing to form the various layers of metallization so as to complete the formation of the nFET and pFET devices in the semiconductor structure 10.

It should be understood further that while the process flow illustrated in the Figures results in the first device region 24 being masked off while the second device region 26 is defined, the process flow may be reversed so that the second device region 26 is masked off while the first device region 24 is defined.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of epitaxial replacement of a raised source/drain (RSD) comprising steps of:
    forming a gate structure on a semiconductor substrate;
    forming a faceted dummy RSD having facets adjacent to the gate structure such that a corner is formed at a juncture of the gate structure and the semiconductor substrate between the gate structure and one of the facets of the faceted dummy RSD, wherein the faceted dummy RSD is an RSD that is formed above a channel of the gate structure and is to be replaced with a real RSD in a subsequent process;
    forming a dielectric material over the corner to fill the corner, contact the gate structure and contact the one of the facets;
    removing the faceted dummy RSD adjacent to the gate structure to leave a faceted corner in the dielectric material formerly occupied by the faceted dummy RSD;
    forming the real RSD by epitaxially growing the real RSD adjacent to the gate structure including epitaxially growing the real RSD in the faceted corner in the dielectric material;
    wherein there are a plurality of gate structures and the steps of forming the faceted dummy RSD, forming the dielectric material over the corner, removing the faceted dummy RSD and forming the real RSD are performed for each gate structure and wherein at least one gate structure of the plurality of gate structures is for an nFET and at least one gate structure of the plurality of gate structures is for a pFET.

2. The method of claim 1 wherein forming a dielectric material over the corner comprises:
    depositing the dielectric material over the gate structure and the faceted dummy RSD; and
    forming a spacer to the gate structure from the dielectric material.

3. The method of claim 1 further comprising annealing the semiconductor substrate.

4. A method of epitaxial replacement of a raised source/drain (RSD) comprising:
    forming first and second gate structures on a semiconductor substrate wherein one of the first and second gate structures is for an nFET and the other of the first and second gate structures is for a PFET;
    forming a faceted dummy RSD adjacent to each of the first and second gate structures, wherein each of the faceted dummy RSDs is an RSD that is formed above a channel of the gate structure, has facets and is to be replaced with a real RSD in a subsequent process;
    depositing a dielectric material over the first and second gate structures and the faceted dummy RSD adjacent to each of the first and second gate structures;
    applying a first masking material to the dielectric material over the first gate structure and the faceted dummy RSD adjacent to the first gate structure;
    forming a spacer adjacent to the second gate structure from the dielectric material while removing the dielectric from the top of the second gate structure and the faceted dummy RSD adjacent to the second gate structure;
    removing the faceted dummy RSD adjacent to the second gate structure to leave a faceted corner in the spacer adjacent to the second gate structure, the faceted corner in the spacer adjacent to the second gate structure being formerly occupied by the faceted dummy RSD adjacent to the second gate structure;
    replacing the faceted dummy RSD adjacent to the second gate structure with the real RSD by epitaxially growing the real RSD adjacent to the second gate structure including epitaxially growing the real RSD in the faceted corner in the spacer adjacent to the second gate structure;
    applying a second masking material to the second gate, spacer and the epitaxially grown RSD adjacent to the second gate structure;
    forming a spacer adjacent to the first gate structure from the dielectric material while removing the dielectric from the top of the first gate structure and the faceted dummy RSD adjacent to the first gate structure;
    removing the faceted dummy RSD adjacent to the first gate structure to leave a faceted corner in the spacer adjacent to the first gate structure, the faceted corner in the spacer adjacent to the first gate structure being formerly occupied by the faceted dummy RSD adjacent to the first gate structure;
    replacing the faceted dummy RSD adjacent to the first gate structure with the real RSD by epitaxially growing the real RSD adjacent to the first gate structure including epitaxially growing the real RSD in the faceted corner in the spacer adjacent to the first gate structure; and
    annealing the semiconductor substrate.

5. The method of claim 4 wherein the first gate structure is for an nFET and the second gate structure is for a PFET.

6. The method of claim 5, wherein the epitaxially grown RSD adjacent to the first gate structure is selected from the group consisting of in-situ phosphorus-doped silicon (ISPD Si), in-situ phosphorus-doped and carbon-doped silicon (ISPD Si:C), in-situ arsenic-doped silicon (ISAD Si) and in-situ phosphorus-doped silicon germanium (ISPD SiGe) and the epitaxially grown RSD adjacent to the second gate structure is in-situ boron-doped silicon germanium (ISBD SiGe).

7. The method of claim 4 wherein the first gate structure is for a PFET and the second gate structure is for an nFET.

8. The method of claim 7, wherein the epitaxially grown RSD adjacent to the first gate structure is in-situ boron-doped silicon germanium (ISBD SiGe) and the epitaxially grown RSD adjacent to the second gate structure is selected from the group consisting of in-situ phosphorus-doped silicon (ISPD Si), in-situ phosphorus-doped and carbon-doped silicon (ISPD Si:C), in-situ arsenic-doped silicon (ISAD Si) and in-situ phosphorus-doped silicon germanium (ISPD SiGe).

9. The method of claim 4 wherein the faceted dummy RSDS comprise silicon germanium.

10. The method of claim 4 wherein the semiconductor substrate is a bulk semiconductor substrate or a semiconductor on insulator (SOI) substrate.

11. The method of claim 4 wherein the first and second gate structures are dummy gate structures and the method further comprising:
    removing the dummy gate structures;
    forming replacement gate structures.

12. The method of claim 4 wherein the dielectric material is selected from the group consisting of silicon nitride, silicon oxide, silicon oxynitride, boron nitride, high-k dielectric.

13. The method of claim 4 wherein the first and second masking materials are photoresists.

14. The method of claim 4 wherein the annealing is by a spike anneal process comprising rapidly heating to a first predetermined temperature and then immediately rapidly cooling to a second predetermined temperature.

15. The method of claim 4 wherein the epitaxially growing the real RSDs are by an epitaxial growth process in which the real RSDs are grown entirely without facets including in each of the faceted corners.

16. A method of epitaxial replacement of a raised source/drain (RSD) comprising steps of:
    forming a gate structure on a semiconductor substrate;
    forming a faceted dummy RSD having facets adjacent to the gate structure such that a corner is formed at a juncture of the gate structure and the semiconductor substrate between the gate structure and one of the facets of the faceted dummy RSD, wherein the faceted dummy RSD is an RSD that is formed above a channel of the gate structure and is to be replaced with a real RSD in a subsequent process;
    forming a dielectric material over the corner to fill the corner, contact the gate structure and contact the one of the facets;
    removing the faceted dummy RSD adjacent to the gate structure to leave a faceted corner in the dielectric material formerly occupied by the faceted dummy RSD;
    forming the real RSD by epitaxially growing the real RSD adjacent to the gate structure including epitaxially growing the real RSD in the faceted corner in the dielectric material;
    wherein the step of forming the real RSD is by an epitaxial growth process in which the real RSD is grown entirely by an epitaxial growth process that does not form facets but the resulting real RSD has a faceted surface where the real RSD meets the faceted corner in the dielectric material, the real RSD comprises two contiguous portions, the first portion having the faceted surface in the faceted corner and a first height with respect to the substrate, the second portion outside the faceted corner having a second height with respect to the substrate wherein the first height is less than the second height.

* * * * *